(12) United States Patent
Mizutani et al.

(10) Patent No.: US 7,175,706 B2
(45) Date of Patent: Feb. 13, 2007

(54) PROCESS OF PRODUCING MULTICRYSTALLINE SILICON SUBSTRATE AND SOLAR CELL

(75) Inventors: Masaki Mizutani, Shiga (JP); Shunichi Ishihara, Shiga (JP); Katsumi Nakagawa, Kanagawa (JP); Hiroshi Sato, Shiga (JP); Takehito Yoshino, Shiga (JP); Shoji Nishida, Kanagawa (JP); Noritaka Ukiyo, Shiga (JP); Masaaki Iwane, Shiga (JP); Yukiko Iwasaki, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 10/505,979

(22) PCT Filed: Feb. 21, 2003

(86) PCT No.: PCT/JP03/01914

§ 371 (c)(1),
(2), (4) Date: Aug. 27, 2004

(87) PCT Pub. No.: WO03/073441

PCT Pub. Date: Sep. 4, 2003

(65) Prior Publication Data
US 2005/0124139 A1    Jun. 9, 2005

(30) Foreign Application Priority Data
Feb. 28, 2002 (JP) .............................. 2002-054340

(51) Int. Cl.
*C30B 11/14* (2006.01)
(52) U.S. Cl. .......................................... 117/81; 117/83
(58) Field of Classification Search .................. 117/81, 117/83
See application file for complete search history.

(56) References Cited

U.S. PATENT DOCUMENTS

| 6,013,872 A | * | 1/2000 | Woditsch et al. ........... 136/255 |
| 6,387,780 B1 | | 5/2002 | Nishida ...................... 438/497 |
| 2002/0009895 A1 | | 1/2002 | Nishida ...................... 438/758 |

FOREIGN PATENT DOCUMENTS

| JP | 07-215714 | 8/1995 |
| JP | 10/98205 | 4/1998 |
| JP | 11-92284 | 4/1999 |
| JP | 11-116386 | 4/1999 |
| JP | 11-288881 | 10/1999 |
| JP | 2000/1308 | 1/2000 |
| JP | 2000-114556 | 4/2000 |
| JP | 2001-19593 | 1/2001 |

OTHER PUBLICATIONS

Derwent WPI, WPI Acc. No. 1988-232193/198833, abstract of JP 63-166711, Jul. 1988.

* cited by examiner

*Primary Examiner*—Felisa Hiteshew
(74) *Attorney, Agent, or Firm*—Fitzpatrick, Cella, Harper & Scinto

(57) ABSTRACT

There is provided a process of producing a multicrystalline silicon substrate having excellent characteristics as a solar cell substrate. A multicrystalline silicon ingot made by directional solidification 10 is cut such that a normal line of a principal surface 14 of a multicrystalline silicon substrate 13 is substantially perpendicular to a longitudinal direction of crystal grains 11 of the multicrystalline silicon ingot made by directional solidification 10.

5 Claims, 2 Drawing Sheets

US 7,175,706 B2

PROCESS OF PRODUCING MULTICRYSTALLINE SILICON SUBSTRATE AND SOLAR CELL

TECHNICAL FIELD

The present invention relates to a process of producing a multicrystalline (or polycrystalline) silicon substrate, particularly, a multicrystalline silicon substrate suitable as a substrate for a solar cell (hereinafter, referred to as "solar cell substrate"), and to a process of producing a solar cell using the same.

BACKGROUND ART

A multicrystalline silicon substrate has been widely used as a solar cell substrate. The multicrystalline silicon substrate is obtained by cutting a multicrystalline silicon ingot (Japanese Patent Application Laid-Open No. 11-288881, etc.).

One of the processes for producing the multicrystalline silicon ingot comprises holding a silicon powder as a source material in a crucible, heating the silicon powder by a heater surrounding the crucible to melt the silicon powder, slowly moving the crucible downward away from the heater to cool the crucible from the lower part to obtain the multicrystalline silicon ingot (Japanese Patent Publication No. 4-68276, etc.). The multicrystalline silicon ingot obtained by the process has individual crystal grains of an elongated shape arranged substantially in one direction. Such a multicrystalline silicon ingot is generally called a multicrystalline silicon ingot made by directional solidification.

Generally, a substrate is obtained from an ingot by cutting with a wire saw. In the case of a conventional solar cell multicrystalline silicon substrate, the multicrystalline silicon ingot made by directional solidification is cut orthogonal to the longitudinal direction of crystal grains (Japanese Patent Publication No. 4-68276, Japanese Patent Application Laid-Open No. 2000-1308, etc.). Namely, crystal grains are cut so that the longitudinal direction thereof is in agreement with a normal line of a principal surface of a substrate. This cutting method is herein referred to as "transverse cutting."

The "transverse cutting" is selected as a conventional cutting method of an ingot because if a number of grain boundaries exist approximately perpendicularly to a thickness direction of a substrate, charge transfer is prevented at the grain boundary portions to cause charge recombination and loss in electric current. In other words, the agreement of the longitudinal direction of the crystal grains with the thickness direction of the cut substrate decreases grain boundaries crossing the thickness direction of the substrate and can suppress the loss in current, so that the transverse cutting has hitherto been adopted.

In addition, Japanese Patent Application Laid-Open No. 10-98205 describes a technology in which instead of making a solar cell in the above mentioned multicrystalline silicon substrate itself, a silicon film with a low impurity content is grown on an inexpensive metallurgical grade multicrystalline silicon substrate having a high impurity concentration, and a solar cell is made in the thus grown silicon film.

DISCLOSURE OF THE INVENTION

According to the study by the present inventors, in the case of the conventional transversely-cut multicrystalline silicon substrate, particularly in the case of a transversely-cut metallurgical grade multicrystalline silicon substrate, growing a silicon film on the substrate and forming a solar cell in the film has not always provided desired characteristics. The reason is not clear, but is considered that although the transversely-cut substrate has a small number of grain boundaries crossing the substrate thickness direction, a very large number of grain boundaries existing in the substrate thickness direction (i.e., grain boundaries extending from a front surface to a back surface of the substrate) may affect the characteristics.

It is, therefore, a principal object of the present invention to provide a multicrystalline silicon substrate having excellent characteristics particularly as a solar cell substrate.

The object of the present invention is achieved by the means described below.

The present invention provides a process of producing a multicrystalline silicon substrate from a multicrystalline silicon ingot made by directional solidification, which comprises the step of cutting a multicrystalline silicon ingot made by directional solidification such that a normal line of a principal surface of a multicrystalline silicon substrate is substantially perpendicular to a longitudinal direction of crystal grains of the multicrystalline silicon ingot made by directional solidification.

The expression "longitudinal direction of crystal grains" as herein employed is intended to mean an average of longitudinal directions of a plurality of crystal grains. For example, when forming a temperature gradient in a vertical direction in molten silicon to produce a multicrystalline silicon ingot made by directional solidification, the direction in which the temperature gradient is formed can be regarded as the "longitudinal direction of crystal grains."

In the above-mentioned process of producing a multicrystalline silicon substrate according to the present invention, it is preferred that an average value of the aspect ratios of the crystal grains appearing in the principal surface of the multicrystalline silicon substrate is more than 4, and that the multicrystalline silicon ingot made by directional solidification comprises metallurgical grade multicrystalline silicon.

Further, the present invention also includes a process of producing a solar cell, comprising the steps of epitaxially growing a silicon film on a multicrystalline silicon substrate obtained by the above-mentioned production process of the present invention, and forming a pn-junction using the silicon film.

As a method of the epitaxial growth of a silicon film, a liquid phase epitaxy method or vapor phase epitaxy method such as plasma CVD can be employed.

Examples of the step of forming a pn-junction includes a step of forming a pn-junction in a silicon film obtained by epitaxial growth, a step of forming a pn-junction comprising silicon films obtained by epitaxial growth (for example, forming a p-type silicon film by epitaxial growth and forming an n-type amorphous silicon film by CVD on the thus obtained p-type silicon film).

BEST MODE FOR CARRYING OUT THE INVENTION

Figure 1:
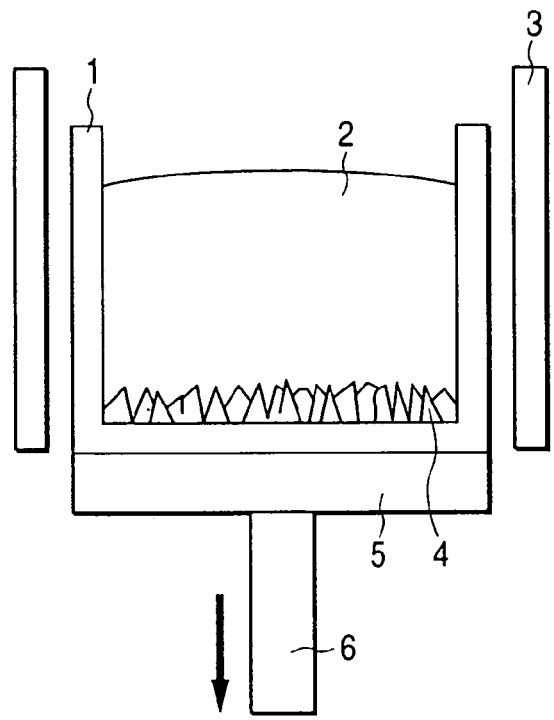
FIG. 1 is a view illustrating a process of producing a multicrystalline silicon ingot made by directional solidification.

FIG. 1 illustrates a process of producing a multicrystalline silicon ingot made by directional solidification for yielding the multicrystalline silicon substrate according to the present invention.

In FIG. 1, molten silicon 2 is held in a crucible 1. A heater 3 is provided around the crucible 1 to maintain the molten silicon 2 in the molten state. The crucible 1 is placed on a support 5 and can be moved along with the support 5 downwardly by means of a lowering rod 6. As the crucible 1 is moved downwardly, a unidirectionally solidified multicrystal 4 grows upwardly from the bottom of the crucible 1, thereby finally providing a multicrystalline silicon ingot made by directional solidification having crystal grains of an elongated shape oriented approximately in one direction.

As the material of the molten silicon 2, inexpensive metallurgical grade silicon can suitably be used. The expression "metallurgical grade silicon" as herein employed is intended to mean "silicon obtained directly by reducing silica sand," which generally has a purity of less than 99.99%, but is available at a far lower price than the so-called semiconductor-grade or solar cell-grade silicon.

Figure 2:
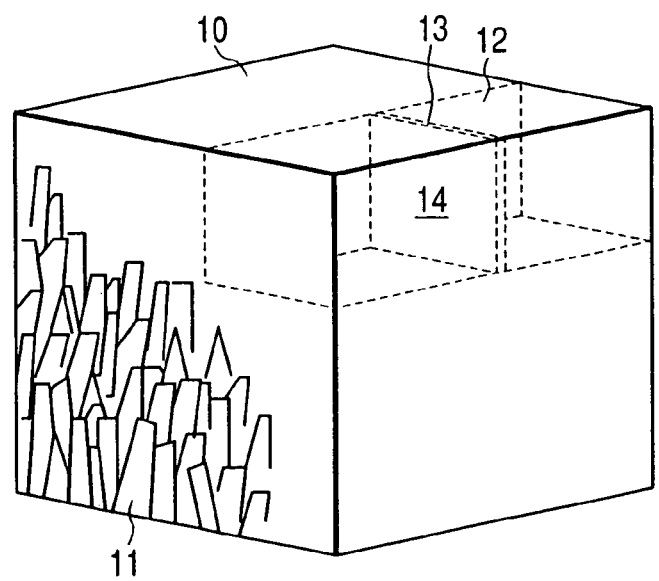
FIG. 2 is a view illustrating a process for obtaining a multicrystalline silicon substrate according to the present invention from a multicrystalline silicon ingot made by directional solidification.

FIG. 2 illustrates a process for obtaining a multicrystalline silicon substrate according to the present invention from the multicrystalline silicon ingot made by directional solidification obtained as described above. FIG. 2 schematically shows, on a part of an ingot surface, the state in which the multicrystalline silicon ingot made by directional solidification 10 has crystal grains 11 of an elongated shape oriented approximately in a vertical direction.

In the process of producing a multicrystalline silicon substrate according to the present invention, the multicrystalline silicon ingot made by directional solidification 10 is cut such that a normal line of a principal surface 14 of a multicrystalline silicon substrate 13 is substantially perpendicular to the longitudinal direction of the crystal grains of the multicrystalline silicon ingot made by directional solidification 10. This method for cutting an ingot according to the present invention is hereinafter referred to as "longitudinal cutting."

The "longitudinal direction of crystal grains" of the multicrystalline silicon ingot made by directional solidification may be considered as the growth direction of the crystal grains, or the moving direction of the crucible 1 when the multicrystalline silicon ingot made by directional solidification is produced as shown in FIG. 1. The angular range of the expression "substantially perpendicular" is 90°±30°, preferably 90°±6°.

The conventional wire saw and the like may be used for cutting the ingot. Generally, after the ingot 10 is divided into a plurality of ingots 12 each of a rectangular solid shape, each rectangular solid ingot 12 is sliced to obtain the multicrystalline silicon substrate 13. FIG. 2 schematically illustrates an example of cutting one rectangular solid ingot 12 from the ingot 10, and cutting the multicrystalline silicon substrate 13 from the rectangular solid ingot 12.

In the longitudinally-cut multicrystalline silicon substrate obtained by the present invention, those individual crystal grains which appear in the principal surface of the substrate have an elongated needle-shape or column-shape having a longer side of approximately 5 mm to 50 mm and a shorter side of approximately 1 mm to 5 mm, and these crystal grains have a greater aspect ratio than that of the conventional transversely-cut multicrystalline silicon substrate.

The expression "aspect ratio of crystal grains" herein employed is defined, when a reference axis is set approximately parallel to the longitudinal direction of the crystal grains appearing in the principal surface of a substrate, as the ratio of the length parallel to the reference axis to the length perpendicular to the reference axis for each crystal grain. Further, the "average value of aspect ratios of crystal grains" obtained by arithmetically averaging the aspect ratios of individual crystal grains contained in a region of 40 mm square of the principal surface of a substrate is more than 4 for the longitudinally-cut multicrystalline silicon substrate according to the present invention, and is typically about 10 (note that the conventional transversely-cut multicrystalline silicon substrate has an "average value of aspect ratios of crystal grains" of at most about 3.5, which is less than 4).

By using the longitudinally-cut multicrystalline silicon substrate obtained by the present invention, as described below, a highly-efficient solar cell exhibiting less influence of grain boundaries in the current flow direction as well as within the plane can be obtained. In particular, when longitudinally cutting a multicrystalline silicon ingot made by directional solidification consisting of crystal grains having a typical aspect ratio of about 10 to 1, for preventing increase of grain boundaries appearing in the principal surface of a substrate after the cutting, the angle formed between the normal direction of the principal surface of a substrate and the longitudinal direction of the crystal grains is desirably from 84° to 90°.

Further, when a longitudinally-cut multicrystalline silicon substrate is used as a solar cell silicon substrate, it is preferred that the thickness of the substrate is from 0.3 mm to 1 mm, and the size of the substrate is approximately 50 mm square to 200 mm square. In addition, particularly with the aim of a low price solar cell, inexpensive metallurgical grade silicon can be used as the multicrystalline silicon.

The process of producing a solar cell according to the present invention comprises epitaxially growing a silicon film on the above-described longitudinally-cut multicrystalline silicon substrate, forming a pn-junction using the silicon film and further making an electrode or the like.

As a method of the epitaxial growth, a vapor phase epitaxy method such as plasma CVD or liquid phase epitaxy method can be used. Generally, the film forming rate in the CVD method is approximately 10 Å per second at the maximum. On the other hand, the liquid phase epitaxy method (LPE method) attains a film forming rate of approximately 2 μm per minute, provides a film of excellent quality and is capable of extremely reducing the film forming cost compared with the CVD method, so that use of the liquid phase epitaxy method is preferred in the present invention.

Further, especially when metallurgical grade silicon is used as a multicrystalline silicon substrate, it is preferred to grow a silicon film at as low a temperature as possible so as to prevent diffusion of impurities from the silicon substrate to the silicon film during the epitaxial growth step.

Furthermore, it is preferable that prior to the epitaxial growth of the silicon film, the substrate is cleaned with a mixture solution of sulfuric acid and an aqueous hydrogen peroxide solution, and then subjected to the so-called planar etching (planarization) with a mixed acid consisting of hydrofluoric acid, nitric acid and acetic acid.

Figure 3:
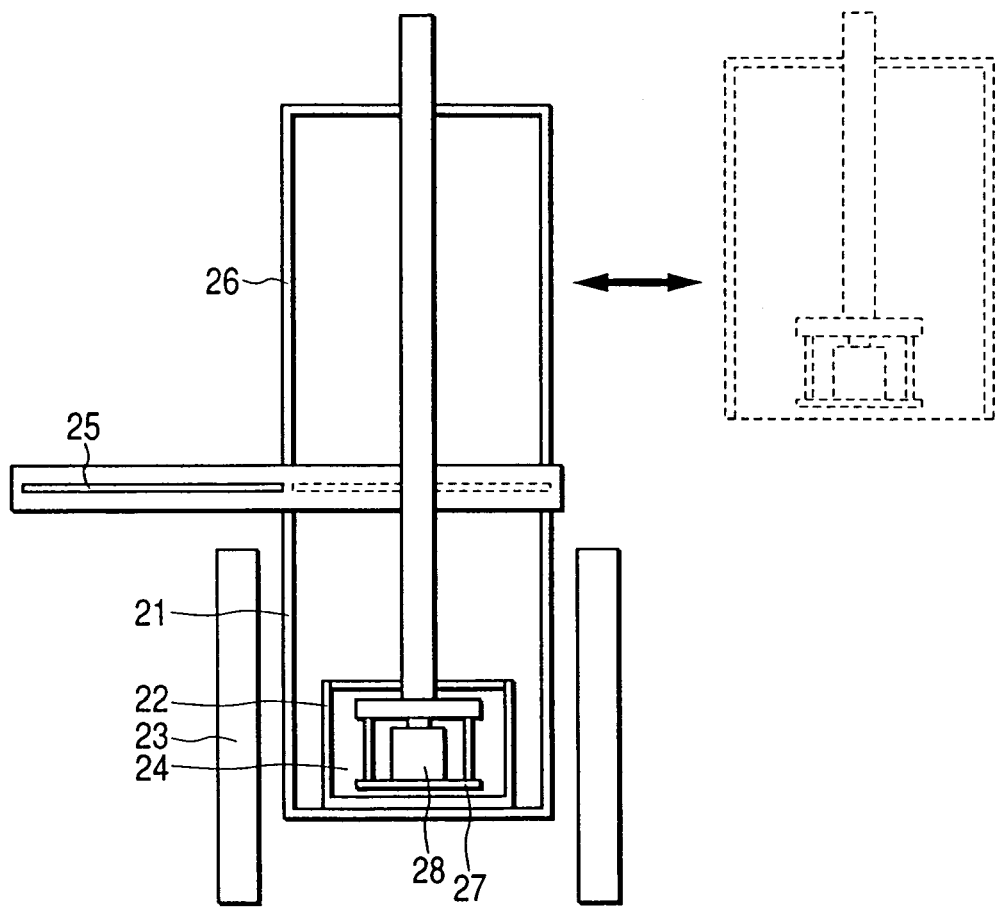
FIG. 3 is a schematic view showing an example of a liquid phase epitaxial growth apparatus for a silicon film.

FIG. 3 shows an example of an apparatus for liquid phase epitaxial growth of a silicon film. A growth furnace 21 is provided with a crucible 22 therein, and is surrounded by a heater 23. The crucible 22 holds a melt 24 prepared by dissolving a silicon source material into a metal such as tin, indium, copper, aluminum, or the like in a saturation state. The melt 24 may contain a dopant such as gallium, phosphorus, boron, aluminum, or the like. A load-lock chamber 26 is coupled to the top of the growth furnace 21 through a gate valve 25. The load-lock chamber 26 is movable in a horizontal direction and is provided with a substrate holder 27 therein.

The growth step is performed as follows. The growth furnace 21 is maintained at a saturation temperature of the melt in a hydrogen atmosphere with the gate valve 25 being closed. When the load-lock chamber 26 is in a state separated from the growth furnace 21, the substrate 28 is disposed in the substrate holder 27. Then, the load-lock chamber 26 is combined with the growth furnace 21, and the inside atmosphere is replaced with hydrogen. Subsequently, the gate valve 25 is opened; the substrate 27 is moved downwardly; and the substrate 28 is heated for a given period of time in the hydrogen atmosphere. Then, the temperature of the growth furnace 21 is reduced to cool the melt 24 until the silicon source material is supersaturated in the melt 24. When the furnace temperature reaches a given supersaturation degree, the substrate holder 27 is further moved downwardly to immerse the substrate 28 in the melt 24. When reducing the temperature of the growth furnace 21 at a given temperature reducing rate, a silicon film is epitaxially grown on the substrate 28. When a desired film is grown, the substrate holder 27 is moved upwardly; the gate valve 25 is closed; the atmosphere inside the load-lock chamber 26 is replaced with air; the load-lock chamber 26 is separated from the growth furnace 21; and the substrate 28 is taken out.

Figure 4:
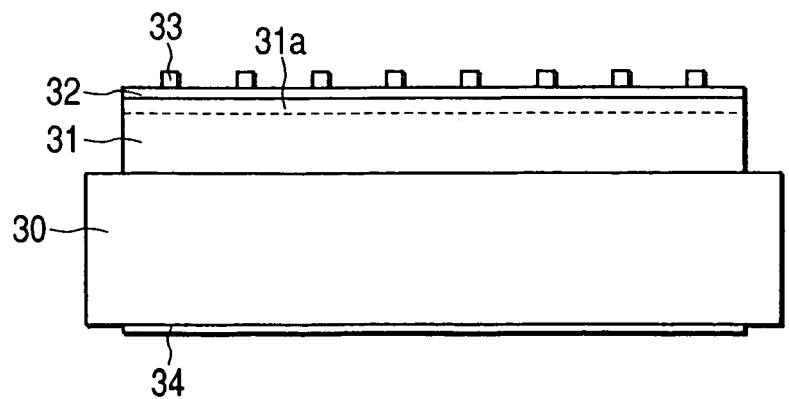
FIG. 4 is a schematic sectional view showing an example of the configuration of the solar cell according to the present invention.

FIG. 4 is a schematic sectional view showing a constitutional example of the solar cell according to the present invention. A p-type silicon film 31 is formed on a longitudinally-cut multicrystalline silicon substrate 30 in accordance with the present invention. An n⁺-type layer 31a, a reflection preventive film 32, and a collecting electrode 33 are formed on the surface of the silicon film 31. A back surface electrode 34 is formed on the back surface of the substrate 30. The p-type silicon film 31 may be formed using the above-described liquid or vapor phase epitaxy method. The n⁺-type layer 31a may be formed using diffusion, ion implantation, or the like. The reflection preventive film 32 may be formed using sputtering, vapor deposition, or the like. The collecting electrode 33 and the back surface electrode 34 may be formed using sputtering, vapor deposition, printing, or the like.

Alternatively, in another embodiment of the solar cell of the present invention, a solar cell may have a heterojunction with an amorphous film on a longitudinally-cut multicrystalline silicon substrate in accordance with the present invention. Specifically, there may be adopted such a configuration that an amorphous i-type layer and an amorphous n-type layer are stacked on the p-type silicon film 31. The amorphous layers may be formed by, for example, a CVD method.

EXAMPLE

An example of the present invention will now be described in detail, but the present invention is not limited to the example.

(Preparation of Solar Cell Multicrystalline Silicon Substrate)

A metallurgical grade multicrystalline silicon ingot was prepared using the apparatus shown in FIG. 1. The crucible 1 had an inside dimension of 600 mm×600 mm×800 mm (depth) and was made of carbon. The molten silicon 2 was prepared by melting metallurgical grade silicon powder. The lowering rod 6 was moved downwardly to gradually withdraw the crucible 1 downwardly, and after cooling, the crucible 1 was destroyed to obtain the metallurgical grade multicrystalline silicon ingot having a cubic shape of 600 mm square. The ingot was a unidirectionally solidified multicrystal having the orientation of crystal grains approximately unified in the longitudinal direction.

The ingot was divided, as shown in FIG. 2, into rectangular solid ingots each having a size of 47 mm×47 mm×600 mm (length). Further, the rectangular solid-shaped ingot was cut to obtain the metallurgical grade multicrystalline silicon substrate 12 the normal line of the principal surface of which is substantially perpendicular to the longitudinal direction of the crystal grains 11. The obtained substrate had a size of 47 mm×47 mm×0.6 mm (thickness), and the crystal grains 11 appearing in the surface of the substrate had a size of a width of several millimeters and a length of more than 50 mm.

(Pretreatment of Substrate)

The metallurgical grade multicrystalline silicon substrate obtained above was cleaned with running water for 5 minutes, and then immersed in a 3:1 mixture solution of sulfuric acid and an aqueous hydrogen peroxide solution for 10 minutes. Next, the substrate was cleaned with running water for 5 minutes, and then immersed in a 600:136:64 mixture solution of nitric acid:acetic acid:hydrofluoric acid for 6 minutes and 30 seconds to effect the planar etching. Finally, the substrate was cleaned with running water for 5 minutes and then dried with blowing of dry nitrogen thereto to finish the pretreatment of the substrate.

(Preparation of Solar Cell)

Using the liquid phase epitaxy apparatus shown in FIG. 3, a silicon film was epitaxially grown on the above described metallurgical grade multicrystalline silicon substrate. The melt 24 was obtained by dissolving a silicon source material into indium at 900° C. to attain saturation. After the temperature of the melt 24 was reduced to 885° C. to attain supersaturation, the substrate 28 was immersed in the supersaturated melt. The substrate 28 was rotated at a rate of 10 times per minute in the melt. The melt 24 was slowly cooled at a temperature reducing rate of 1° C. per minute for a period of 120 minutes to obtain a silicon film having a thickness of 80 µm. The silicon film was a p-type silicon film with a very small impurity content and had a composition different from that of the underlying metallurgical grade silicon substrate.

Next, a solar cell having a configuration as shown in FIG. 4 was prepared. On the multicrystalline silicon substrate 30 was formed the p-type silicon film 31 by the liquid phase method as described above. On the surface of the silicon film 31 was applied an n-type diffusion agent in a thickness of 2,000 Å and then fired at 860° C. to form the n⁺-type layer 31a. Subsequently, ITO (Indium Tin Oxide) was formed by sputtering in a thickness of 820 Å as the reflection preventive film 32. Next, silver was deposited in a thickness of 2.8 µm by vapor deposition utilizing a mask pattern to form the collecting electrode 33. Then, gold was vapor-deposited on the back surface of the substrate 30 in a thickness of 1,000 Å to form the back surface electrode 34.

The thus formed solar cell had a photoelectric conversion efficiency of 11.26%.

COMPARATIVE EXAMPLE

A columnar, rectangular solid ingot extending parallel to the longitudinal direction of crystal grains was cut to obtain a transversely-cut metallurgical grade multicrystalline silicon substrate the normal line of the principal surface of which is substantially parallel to the longitudinal direction of the crystal grains. A solar cell was formed following the procedure of Example with the exception that this transversely-cut metallurgical grade multicrystalline silicon substrate was used instead of the longitudinally-cut metallurgical grade multicrystalline silicon substrate.

The thus formed solar cell had a large shunt, which made it unable to measure the photoelectric conversion efficiency.

INDUSTRIAL APPLICABILITY

As described above, the longitudinally-cut multicrystalline silicon substrate obtained by the present invention has larger crystal grains than those of the conventional transversely-cut substrates. Use of the longitudinally-cut multicrystalline silicon substrate makes it possible to provide a solar cell having a small shunt and a high photoelectric conversion efficiency. Particularly, use of the metallurgical grade silicon as the above-described multicrystalline silicon substrate makes it possible to provide an inexpensive solar cell without impairing the characteristics.

The invention claimed is:

1. A process of producing a multicrystalline silicon substrate from a multicrystalline silicon ingot made by directional solidification, comprising the step of cutting a multicrystalline silicon ingot made by directional solidification such that a normal line of a principal surface of a multicrystalline silicon substrate is substantially perpendicular to a longitudinal direction of crystal grains of the multicrystalline silicon ingot made by directional solidification wherein an average value of the aspect ratios of the crystal grains appearing in the principal surface of the multicrystalline silicon substrate is more than 4.

2. The process of producing a multicrystalline silicon substrate according to claim 1, wherein the multicrystalline silicon ingot made by directional solidification comprises metallurgical grade multicrystalline silicon.

3. A process of producing a solar cell, comprising the steps of epitaxially growing a silicon film on a multicrystalline silicon substrate obtained by the production process according to claim 1, and forming a pn-junction using the silicon film.

4. The process of producing a solar cell according to claim 3, wherein the epitaxial growth of the silicon film is carried out using a liquid phase epitaxy method.

5. The process of producing a solar cell according to claim 3, wherein the epitaxial growth of the silicon film is carried out using a vapor phase epitaxy method.

* * * * *

UNITED STATES PATENT AND TRADEMARK OFFICE
CERTIFICATE OF CORRECTION

PATENT NO. : 7,175,706 B2 Page 1 of 1
APPLICATION NO. : 10/505979
DATED : February 13, 2007
INVENTOR(S) : Mizutani et al.

It is certified that error appears in the above-identified patent and that said Letters Patent is hereby corrected as shown below:

On the Title Page, Item [*] Notice: should read --Subject to any disclaimer, the term of this patent is extended or adjusted under 35 USC 154(b) by 24 days.

Signed and Sealed this

Twenty-third Day of September, 2008

JON W. DUDAS
*Director of the United States Patent and Trademark Office*